US009134452B2

(12) United States Patent
Bowler et al.

(10) Patent No.: US 9,134,452 B2
(45) Date of Patent: Sep. 15, 2015

(54) WEIGHTING FUNCTION FOR INCLINATION AND AZIMUTH COMPUTATION

(71) Applicant: Schlumberger Technology Corporation, Sugar Land, TX (US)

(72) Inventors: Adam Bowler, Oxford (GB); Christopher C. Bogath, Gloucestershire (GB); Junichi Sugiura, Bristol (GB); Ken-Vidar Ditlefsen, Gloucestershire (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 515 days.

(21) Appl. No.: 13/710,449

(22) Filed: Dec. 10, 2012

(65) Prior Publication Data

US 2014/0163888 A1 Jun. 12, 2014

(51) Int. Cl.
| | | |
|---|---|---|
| G01V 9/00 | (2006.01) | |
| G06F 15/00 | (2006.01) | |
| G06F 17/50 | (2006.01) | |
| G01V 11/00 | (2006.01) | |
| E21B 47/022 | (2012.01) | |

(52) U.S. Cl.
CPC ................ *G01V 9/00* (2013.01); *E21B 47/022* (2013.01); *G01V 11/00* (2013.01); *G06F 15/00* (2013.01); *G06F 17/5009* (2013.01)

(58) Field of Classification Search
CPC ...................................................... G01V 9/00
USPC ............................................................ 702/9
See application file for complete search history.

(56) References Cited

U.S. PATENT DOCUMENTS

| | | | |
|---|---|---|---|
| 3,791,043 | A | 2/1974 | Russell |
| 4,163,324 | A | 8/1979 | Russell et al. |
| 5,265,682 | A | 11/1993 | Russell et al. |
| 5,353,884 | A | 10/1994 | Misawa et al. |
| 5,806,194 | A | 9/1998 | Rodney et al. |
| 6,427,783 | B2 | 8/2002 | Krueger et al. |

(Continued)

FOREIGN PATENT DOCUMENTS

EP 0793000 9/1997

OTHER PUBLICATIONS

International search report and written opinion for the equivalent PCT patent application No. PCT/US2013/070668 issued on Feb. 21, 2014.

*Primary Examiner* — Bryan Bui
(74) *Attorney, Agent, or Firm* — Chadwick A. Sullivan; Wesley Noah

(57) ABSTRACT

A method, system, and computer readable medium is disclosed to estimate a survey parameter (e.g., attitude) for a drilling operation in a subterranean formation. The survey parameter is calculated using multiple methods with the results of the different methods weighted to improve the accuracy at a given attitude of the tool and angular velocity of the sensor package. Results from the different methods are combined based on a weighting function to generate the improved values of inclination and azimuth. Specifically, the values of the weighting function depend, linearly or nonlinearly, on the attitude of the tool and quality of the survey data. In one scenario, the attitude of the tool is approximated by the most recently obtained static inclination/azimuth. In addition, the quality of the survey data is approximated by a measure of vibration severity that is represented by the number of good data points based on the roll rate.

20 Claims, 7 Drawing Sheets

(56) References Cited

U.S. PATENT DOCUMENTS

| | | |
|---|---|---|
| 6,882,937 B2 | 4/2005 | McElhinney |
| 7,650,269 B2 | 1/2010 | Rodney |
| 7,950,473 B2 | 5/2011 | Sugiura |
| 2002/0005298 A1 | 1/2002 | Estes et al. |
| 2008/0046214 A1* | 2/2008 | Fowler .................. 702/150 |
| 2014/0116776 A1* | 5/2014 | Marx et al. .................. 175/24 |

* cited by examiner

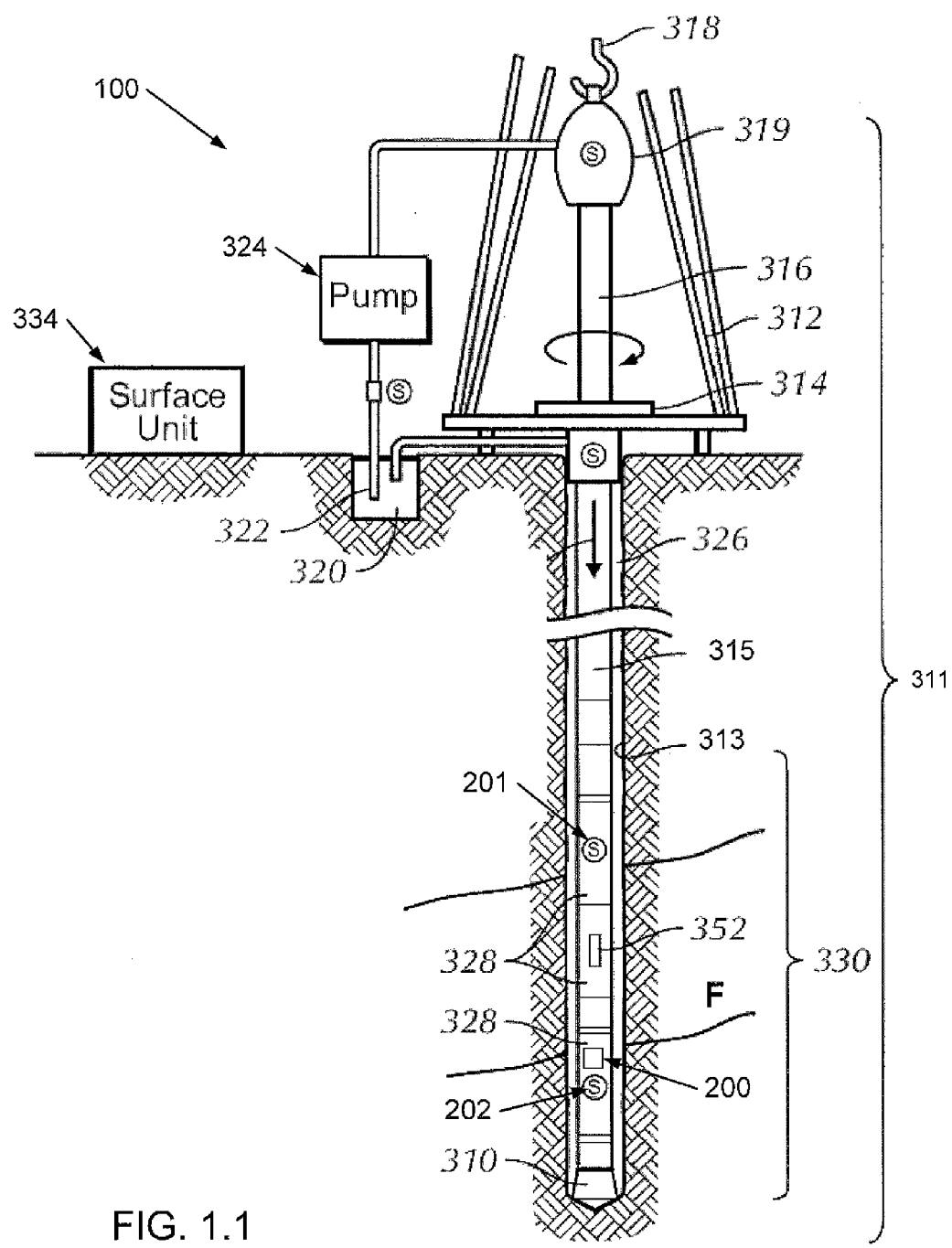
FIG. 1.1

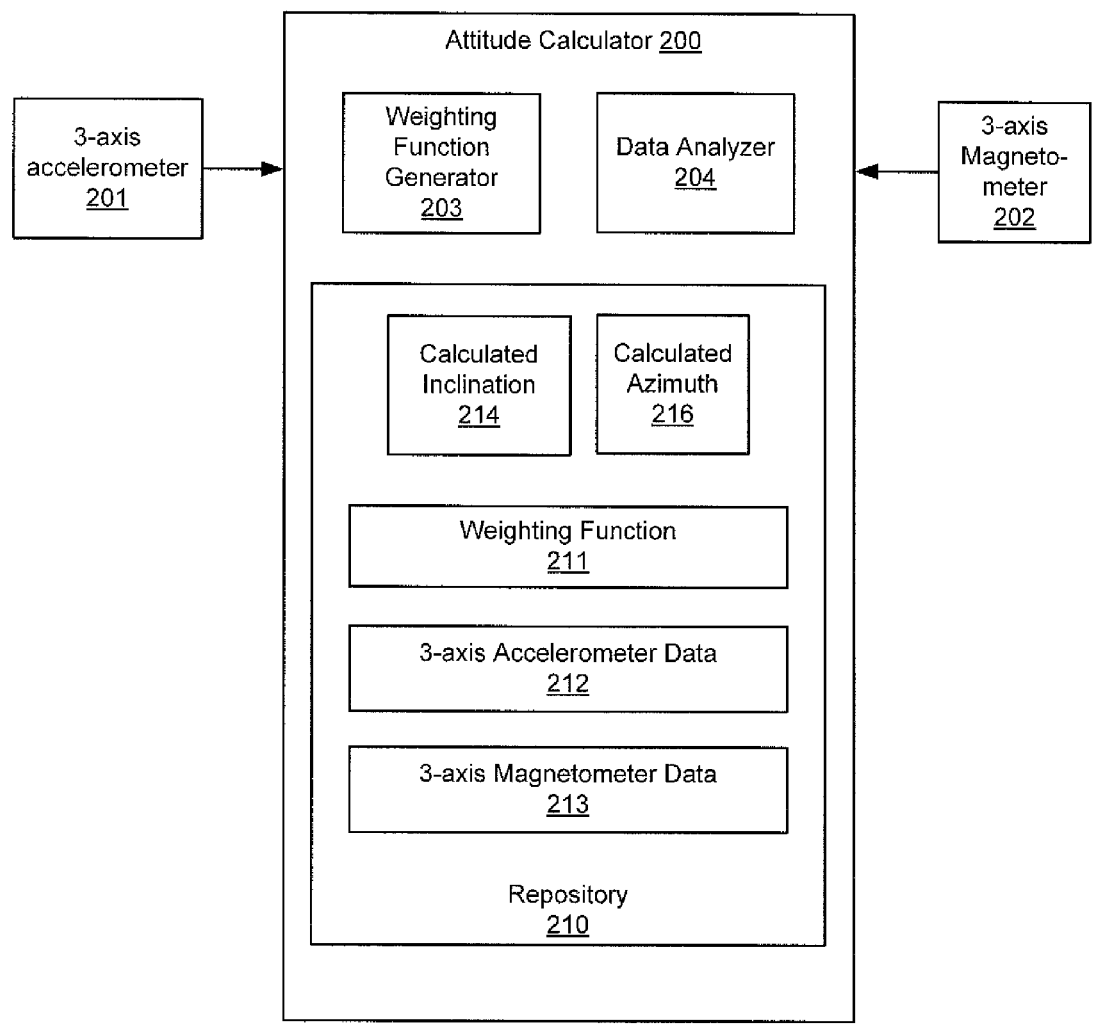
FIG. 1.2

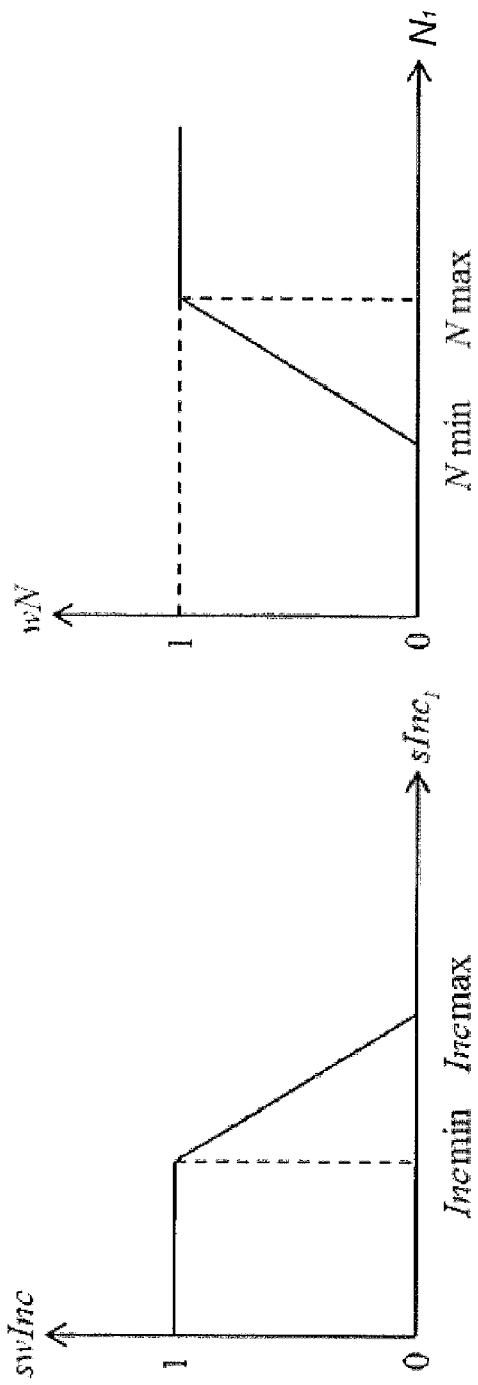
FIG. 1.3
FIG. 1.4
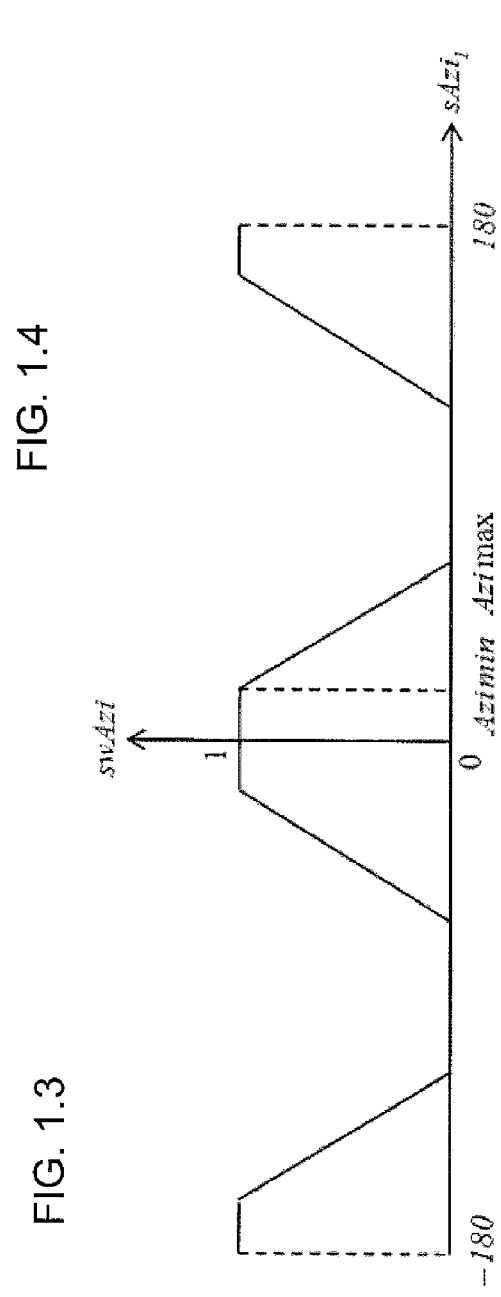
FIG. 1.5

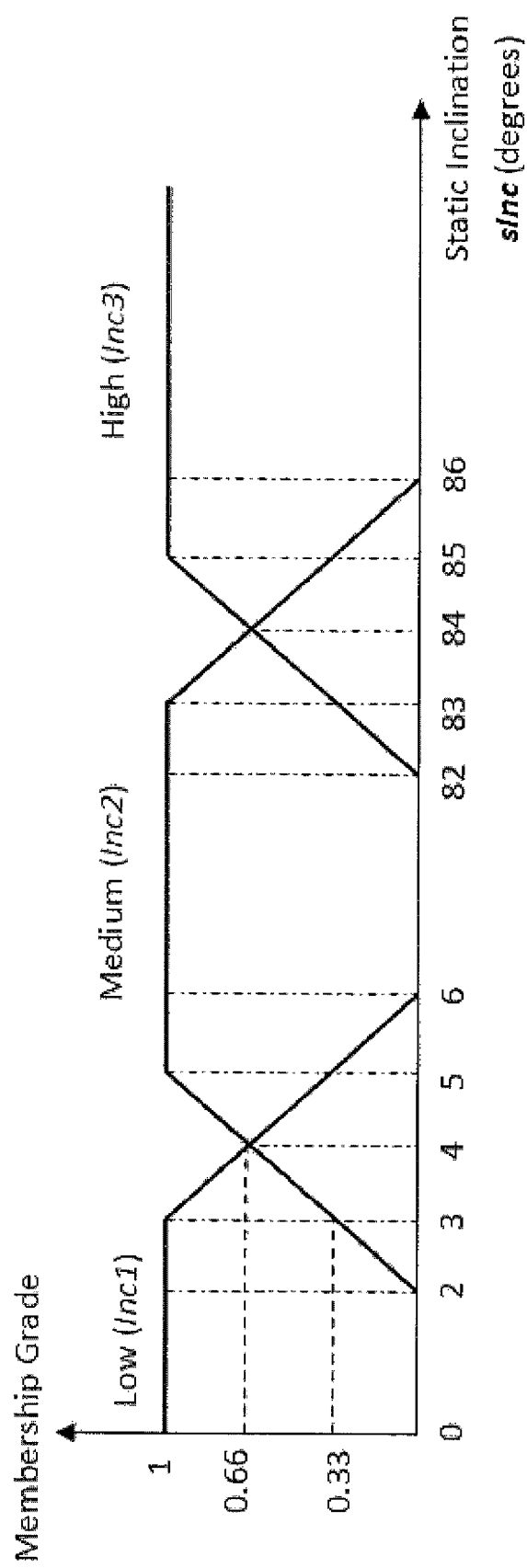
FIG. 1.6

WEIGHTING FUNCTION FOR INCLINATION AND AZIMUTH COMPUTATION

BACKGROUND

Oil drilling is a general term for any boring through the Earth's surface that is designed to find and acquire underground assets such as hydrocarbons. A drillstring on a drilling rig is a column, or string, of drill pipe that transmits drilling fluid and torque to the drill bit. Downhole measurement of drillstring attitude is typically performed for the purpose of steering and automation of drilling tools in directional drilling. The measurement is known as surveying and includes the calculation of the inclination and azimuth of the drillstring with respect to the earth's gravity and magnetic fields. The measurement performed when the drillstring is stationary is referred to as a static survey. The measurement performed when the drillstring is drilling is referred to as a continuous survey.

In current technology, the attitude (i.e., the inclination and azimuth, referred to as survey parameter) is computed using 3-axis accelerometer and 3-axis magnetometer sensor measurements (collectively referred to as survey data). Raw data of these measurements along three mutually-orthogonal axes is referred to as 3-axis data. Normalized projection of the 3-axis data on the axial axis is referred to as normalized axial data. Normalized projection is computed by dividing the axial component of the accelerometer/magnetometer data by the total gravity/magnetic field. The "axial" axis is the drilling axis of a downhole tool and generally referred to as z-axis, as is known to those skilled in the art. The calculation may be performed using 3-axis data (referred to as 3-axis measurement method known in the art) or using normalized axial data (referred to as axial vectors method known in the art). The axial vectors method using the normalized axial data is preferred during drilling when the magnitude of the angular velocity of the drillstring is high. In particular, this avoids using the lateral axis accelerometer data, which can be corrupted by centripetal and tangential components during drilling. However, when the axis of the drillstring at the sensors is substantially parallel (e.g., within +/−10 deg) to the earth's gravity and magnetic fields, sensor noise can lead to large errors in the calculations. In other words, the 3-axis measurement method using 3-axis data becomes less accurate during drilling due to shock/vibration induced noise sensitivity of the sensors. The axial vectors method becomes less accurate when the tool is drilling near vertical or drilling in the north-south plane due to gravity/magnetic field induced noise sensitivity of the sensors. Specifically, the axial vectors method using axial data to calculate inclination becomes less accurate when the tool is drilling near vertical. Similarly, the axial vectors method using axial data to calculate azimuth becomes less accurate either when the tool is drilling in the north-south plane.

SUMMARY

In general, one or more aspects of the present disclosure include a method, system, and computer readable medium to estimate a survey parameter (e.g., attitude) for drilling operations in subterranean formations. These aspects include calculating multiple estimates using different methods and automatically weighting the contributions from the different methods to improve the accuracy of the survey parameter. In the case of attitude, the results from the different methods are combined based on a weighting function to generate the improved values of inclination and azimuth. Specifically, the value(s) of the weighting function depend(s), linearly or non-linearly, on the attitude of the tool and quality of the survey data. In one or more aspects of the present disclosure, the attitude of the tool is approximated by the most recently obtained static inclination/azimuth. In addition, the quality of the survey data is approximated by a measure of vibration severity that is represented by the number of good data points based on the roll rate.

In one or more aspects of the present disclosure, values of the weighting function are used as coefficients in a weighted average formula to combine calculation results from different methods. The weighting function may be used as a membership function of a fuzzy logic model to combine calculation results from multiple different methods. The weighting function may be determined by comparing known attitudes of a stationary drillstring to calculation results from multiple different methods while injecting shock/vibration to emulate the drilling condition. The weighting function may be determined by simulating the calculation results from multiple different methods based on noise model of the drillstring/BHA electronics and a noise sensitivity model of the sensors.

Other aspects will be apparent from the following detailed description and the appended claims.

BRIEF DESCRIPTION OF DRAWINGS

The appended drawings illustrate several embodiments of weighting function for inclination and azimuth computation and are not to be considered limiting of its scope, for weighting function for inclination and azimuth computation may admit to other equally effective embodiments.

FIG. 1.1 is a schematic view of a wellsite depicting a drilling operation in which one or more embodiments of weighting function for inclination and azimuth computation may be implemented.

FIG. 1.2 shows a system using weighting function for inclination and azimuth computation in accordance with one or more embodiments.

FIGS. 1.3-1.6 depict examples of weighting function for inclination and azimuth computation in accordance with one or more embodiments.

DETAILED DESCRIPTION

Figure 2:
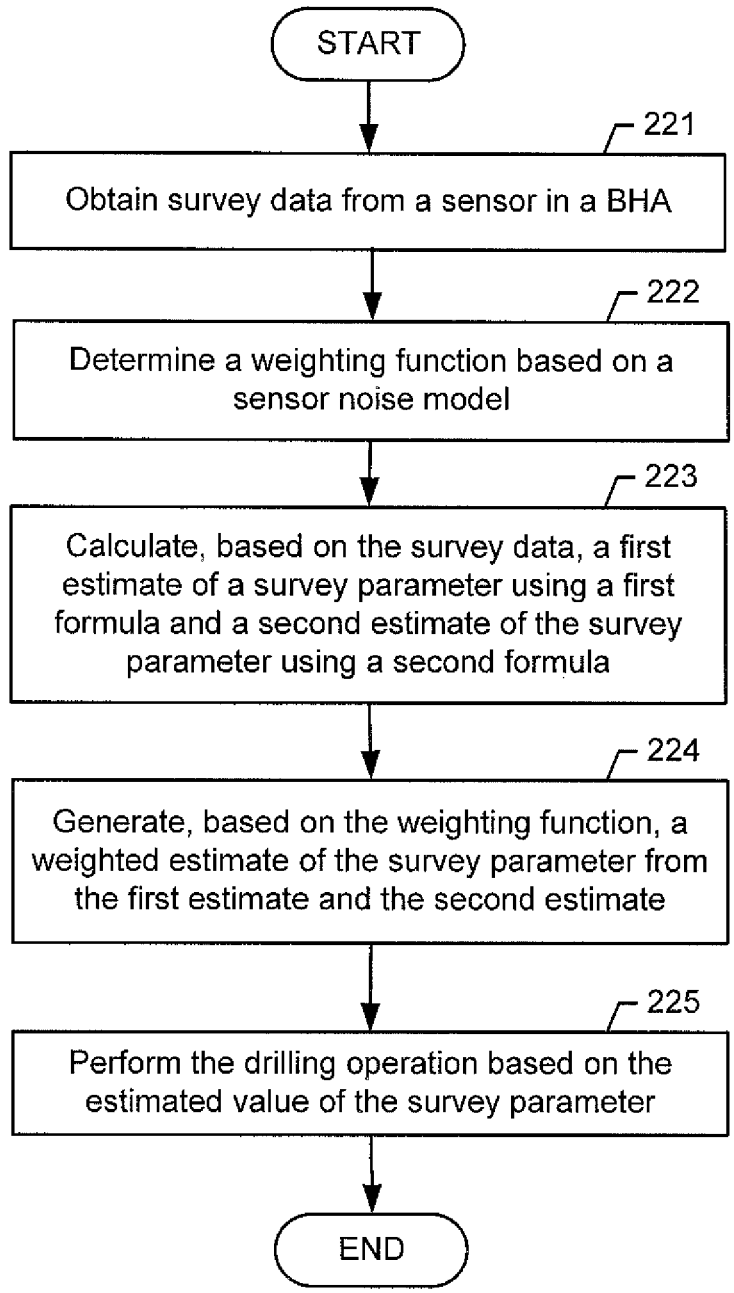
FIG. 2 depicts an example flowchart using weighting function for inclination and azimuth computation in accordance with one or more embodiments.

Aspects of the present disclosure are shown in the above-identified drawings and described below. In the description, like or identical reference numerals are used to identify common or similar elements. The drawings are not necessarily to scale and certain features may be shown exaggerated in scale or in schematic in the interest of clarity and conciseness.

FIG. 1.1 is a schematic view of a wellsite (100) depicting a drilling operation. The wellsite (100) includes a drilling system (311) and a surface unit (334). In the illustrated embodiment, a borehole (313) is formed by rotary drilling in a manner that is well known. Those of ordinary skill in the art given the benefit of this disclosure will appreciate, however, that weighting function for inclination and azimuth computation as disclosed herein may also be used in drilling applications other than conventional rotary drilling (e.g., mud-motor based directional drilling), and is not limited to land-based rigs.

The drilling system (311) includes a drill string (315) suspended within the borehole (313) with a drill bit (310) at its lower end. The drilling system (311) also includes the land-based platform and derrick assembly (312) positioned over the borehole (313) penetrating a subterranean formation (F). The assembly (312) includes a rotary table (314), kelly (316), hook (318) and rotary swivel (319). The drill string (315) is rotated by the rotary table (314), energized by means not shown, which engages the kelly (316) at the upper end of the drill string. The drill string (315) is suspended from hook (318), attached to a traveling block (also not shown), through the kelly (316) and a rotary swivel (319) which permits rotation of the drill string relative to the hook.

The drilling system (311) further includes drilling fluid or mud (320) stored in a pit (322) formed at the well site. A pump (324) delivers the drilling fluid (320) to the interior of the drill string (315) via a port in the swivel (319), inducing the drilling fluid to flow downwardly through the drill string (315) as indicated by the directional arrow. The drilling fluid (320) exits the drill string (315) via ports in the drill bit (310), and then circulates upwardly through the region between the outside of the drill string (315) and the wall of the borehole (313), called the annulus (326). In this manner, the drilling fluid (320) lubricates the drill bit (310) and carries formation cuttings up to the surface as it is returned to the pit (322) for recirculation.

The drill string (315) further includes a bottom hole assembly (BHA) (330), near the drill bit (310). In other words, the BHA may be located within several drill collar lengths from the drill bit. The BHA (330) includes capabilities for measuring, processing, and storing information, as well as communicating with the surface unit (334). The BHA (330) further includes drill collars (328) for performing various other measurement functions. In one or more embodiments, the BHA (330) includes the attitude calculator (200). In one or more embodiments, a portion of the attitude calculator (200), or any component contained therein, may also be included in the surface unit (334).

Sensors (S) are located about the wellsite to collect data, which may be in real time, concerning the operation of the wellsite, as well as conditions at the wellsite. The sensors (S) may also have features or capabilities, of monitors, such as cameras (not shown), to provide pictures of the operation. Surface sensors or gauges (S) may be deployed about the surface systems to provide information about the surface unit, such as standpipe pressure, hook load, depth, surface torque, rotary rotations per minute (rpm), among others. Downhole sensors or gauges (S) are disposed about the drilling tool and/or wellbore to provide information about downhole conditions, such as wellbore pressure, weight on bit, torque on bit, direction, inclination, collar rpm, tool temperature, annular temperature and toolface (i.e., angle of a tool), among others. Multiple downhole sensors (S) may be located at different positions on BHA (330), such as sensor (201) and sensor (202). In one or more embodiments, sensor (201) and sensor (202) may include one or more 3-axis magnetometers and 3-axis accelerometers. In one or more embodiments, a 3-axis magnetometer is a device for measuring the intensity of magnetic fields along three mutually-orthogonal axes. In one or more embodiments, a 3-axis accelerometer is a device for measuring accelerations along three mutually-orthogonal axes. The information collected by the sensors is conveyed to the various parts of the drilling system and/or the surface unit (334).

The BHA (330) and/or surface unit (334) may include all or a portion of an attitude calculator (shown in FIG. 1.2). For example, the attitude calculator (200) may be located on the BHA (330), on the surface unit (334), or a portion may be located on the BHA (330) and another portion may be located on the surface unit (334). Alternatively, all or a portion of the attitude calculator (200) may be located in a remote location from the oilfield. The attitude calculator (200) includes functionality to calculate the inclination and azimuth of the drillstring using multiple methods. Further, in one or more embodiments, the attitude calculator (200) may include functionality to adjust physical components of the BHA (330) in response to calculating the inclination and azimuth. The attitude calculator (200) is discussed in further detail below with respect to FIG. 1.2.

Continuing with FIG. 1.1, the drilling system (311) is operatively connected to the surface unit (334) for communication therewith. The BHA (330) is provided with a communication subassembly (352) that communicates with the surface unit (334). The communication subassembly (352) is adapted to send signals to and receive signals from the surface using mud pulse telemetry. The communication subassembly (352) may include, for example, a transmitter that generates a signal, such as an acoustic or electromagnetic signal, which is representative of the measured drilling parameters. It will be appreciated by one of skill in the art that a variety of telemetry systems may be employed, such as mud pulse telemetry, wired drill pipe, electromagnetic or other known telemetry systems.

Typically, the wellbore is drilled according to a drilling plan that is established prior to drilling. The drilling plan typically sets forth equipment, pressures, trajectories and/or other parameters that define the drilling process for the wellsite. The drilling operation may then be performed according to the drilling plan. However, as information is gathered, the drilling operation may deviate from the drilling plan. Additionally, as drilling or other operations are performed, the subsurface conditions may change. The earth model may also be adjusted as new information is collected. Such information may include results generated by the attitude calculator (200) that are used to identify corrective actions to address a drilling event. For example, the drilling plan may be adjusted based on the calculated inclination and azimuth.

The subterranean assets are not limited to hydrocarbons such as oil, throughout this document, the terms "oilfield" and "oilfield operation" may be used interchangeably with the terms "field" and "field operation" to refer to a site where any type of valuable fluids can be found and the activities for extracting them. The terms may also refer to sites where substances are deposited or stored by injecting them into the surface using boreholes and the operations associated with this process. Further, the term "field operation" refers to a field operation associated with a field, including activities related to field planning, wellbore drilling, wellbore completion, and/or production using the wellbore.

FIG. 1.2 shows more details of the attitude calculator (200) depicted in FIG. 1.1. As shown in FIG. 1.2, the attitude calculator (200) includes a weighting function generator (203), a data analyzer (204), and a data repository (210) storing various data used or generated by the weighting function generator (203) and the data analyzer (204). For example, the weighting function (211) is generated by the weighting function generator (203). The output results of the weighting function (211) are referred to as weighting coefficients or weights. The 3-axis accelerometer data (212) and the 3-axis magnetometer data (213) are used by the data analyzer (204)

to generate the calculated inclination (214) and the calculated azimuth (216). In one or more embodiments, one or more of the modules and elements shown in FIG. 1.2 may be omitted, repeated, and/or substituted. Accordingly, embodiments of weighting function for inclination and azimuth computation should not be considered limited to the specific arrangements of modules shown in FIG. 1.2.

In one or more embodiments, the data repository (210) is any type of storage unit and/or device (e.g., a file system, database, collection of tables, or any other storage mechanism) for storing data. Further, the data repository (210) may include multiple different storage units and/or devices. The multiple different storage units and/or devices may or may not be of the same type or located at the same physical site. For example, a portion of the data repository (210) may be located on the BHA (330) while another portion may be located at the surface unit (334).

In one or more embodiments, the attitude calculator (200) corresponds to hardware, software, or a combination thereof. In one or more embodiments, the attitude calculator (200) is configured to determine inclination (i.e., calculated inclination (214)) and azimuth (i.e., calculated azimuth (216)) based on 3-axis accelerometer data (212) received from the 3-axis accelerometer (201), and 3-axis magnetometer data (213) received from the 3-axis magnetometer (202). In particular, the 3-axis accelerometer data (212) and the 3-axis magnetometer data (213) are referred to as survey data and represent acceleration information and magnetic fields, respectively, in three directions. In one or more embodiments, the 3-axis accelerometer (201) and/or the 3-axis magnetometer (202) may be located on a rotary steerable platform (e.g., rotating with the drill bit up to 250 rotations-per-minute (rpm) during drilling), roll-stabilized platform (e.g., rotating at less than 5 rpm), a non-rotating platform, a slowly-rotating housing (e.g., rotating at less than 20 rotations-per-hour (rph)), or a slowly-rotating sleeve housing with a controlled rotation speed (e.g., rotating at less than 20 rotations-per-hour (rph)). Examples of these platforms/housings are disclosed in U.S. Pat. Nos. 5,265,682, 5,353,884, 6,427,783, and/or 7,950,473.

In one or more embodiments, the survey data includes 3-axis accelerometer data (e.g., the 3-axis accelerometer data (212)) and 3-axis magnetometer data (e.g., the 3-axis magnetometer data (213)) that are captured during a survey time window (e.g., 60 seconds, 3 minutes, etc.). Throughout this disclosure, ($G_x$, $G_y$, $G_z$) and ($B_x$, $B_y$, $B_z$) denote the 3-axis accelerometer and 3-axis magnetometer measurements, respectively. Each component (e.g., $G_x$) of the survey data has m data points, where m is the number of measurements captured during the survey time window. The subscripts denote the sensor axis. The z-axis is aligned with the drillstring axis, the x- and y-axes are perpendicular to the drillstring axis.

The roll rate (i.e., rotation rate, such as measured in rpm) of the sensor (e.g., 3-axis accelerometer (201), 3-axis magnetometer (202)) is also measured during the survey using either a roll gyro (not shown) or using the differential of the magnetic roll angle calculated using the cross-axial/transverse 3-axis magnetometer measurements in near-vertical cases. R denotes the roll rate measurements in the survey.

Sensor measurements are less accurate during drilling due to the rotation of the drillstring that induces shock/vibration. The environmental variables are variables which do not change significantly during drilling, such as the magnitude of the gravity and magnetic vectors, and the magnetic dip angle. These environmental variables can be more accurately determined when drilling is stopped, e.g., when a new drillstring is added. Environmental variables determined when the drilling is stopped (i.e., during the static survey) are then used for calculations performed during drilling. In one or more embodiments, the data analyzer (204) is configured to determine environmental variables defined by equations 1.2a, 1.2b, and 1.2c below.

$$sG_{tot} = \mu\{\sqrt{G_x^2 + G_y^2 + G_z^2}\}, \quad (1.2.a)$$

$$sB_{tot} = \mu\{\sqrt{B_x^2 + B_y^2 + B_z^2}\}, \quad (1.2.b)$$

$$s \sin \text{Dip} = \frac{\mu\{G_x B_x + G_y B_y + G_z B_z\}}{sG_{tot} sB_{tot}}, \quad (1.2.c)$$

where s denotes the static survey and $\mu\{\}$ denotes the mean value of the recorded data over a large number of data samples. For example, the mean value of $G_x$ is expressed as:

$$\mu\{G_x\} \equiv \frac{1}{n}\sum_{i=1}^{n} G_x[i] \equiv \frac{G_x[1] + G_x[2] + \ldots + G_x[n-1] + G_x[n]}{n}.$$

Further, $sG_{tot}$ is the magnitude of the gravity vector, $sB_{tot}$ is the magnitude of the magnetic vector, and s sin Dip is the sine of the magnetic dip angle. In the static survey, there may still be rotation of the sensor platform (and therefore the sensors mounted thereon) in some situations. For example, during normal condition in the static survey, the roll-stabilized platform may be stationary in a non-rotating phase or rotate at less than 5 rpm in a rotating phase, a slowly-rotating housing or a slowly-rotating sleeve housing may rotate at less than 20 rph. From time to time, the roll rate may exhibit abnormally high magnitude due to abnormal conditions, such as a sudden mud flow rate change or the stick-slip condition of the BHA/drill bit. In one or more embodiments, the sensor data obtained during these abnormal conditions are discarded. Specifically, the environmental variables involving accelerometer measurements, determined using equations 1.2a, and 1.2c, are based on sensor data obtained when the roll rate is less than a threshold value: $|R| < R$ max. For example, $R_{max}$ may be set at 5 rpm for the roll-stabilized platform, 20 rph for the slowly-rotating housing or a slowly-rotating sleeve housing. Because the rotary steerable platform and non-rotating platform are normally stationary during static survey, $R_{max}$ may be also set at 5 rpm.

In one or more embodiments, the data analyzer (204) is configured to calculate the inclination angle using axial vectors method and/or 3-axis measurements method based on the environmental variables determined during the static survey. These methods may be used during the static survey when the drilling is stopped or during continuous survey when the drill bit is drilling.

Using the axial vectors method, the inclination is given by the trigonometric function "arcos" of the normalized projection of the gravitational field on the axial axis:

$$Inc_1 = \arccos(G_{zn}), \quad (1.3.1.a)$$

where $$G_{zn} = \frac{\mu\{G_z\}}{sG_{tot}}, \quad (1.3.1.b)$$

is the average axial accelerometer measurement normalized by the denominator $sG_{tot}$ (i.e., the average magnitude of the accelerometer measurement calculated during the static survey.)

Using the 3-axis measurements method, the inclination is given by the trigonometric function "arcsin" of the normalized magnitude of the projection of the gravitational field on the lateral axes:

$$Inc_2 = \arcsin(G_{xyn}), \quad (1.3.2.a)$$

where $$G_{xyn} = \frac{\mu\{\sqrt{G_x^2 + G_y^2}\}}{sG_{tot}}, \quad (1.3.2.b)$$

is the average lateral accelerometer measurement, also normalized by the denominator $sG_{tot}$.

In one or more embodiments, the data analyzer (204) is configured to use the weighting function (211) to determine the calculated inclination (214) from $Inc_1$ and $Inc_2$, such that the 3-axis method is used only when the inclination is low (e.g., less than 10 deg) and when the survey data quality is high. The survey data quality is statistically determined based on how frequent the abnormal conditions occur when the roll rate exceeds $R_{max}$. Similar to determining the environmental variables, sensor data obtained during the abnormal conditions are discarded when calculating the inclination using equations 1.3.1.a through 1.3.2.b. An example formula for determining the calculated inclination (214) is given as:

$$Inc=Inc_1 \cdot (1-swInc \cdot wN) + Inc_2 \cdot swInc \cdot wN, \quad (1.5.1.a)$$

In equation (1.5.1.a), swInc is the weighting function on the inclination. It is based on the inclination $sInc_1$ that is calculated from the axial vector method during the static survey. In one or more embodiments, the inclination $sInc_1$ is determined using the equation (1.3.1a) with the condition that $|R|<R$ max as this result is less prone to sensor noise.

An example weighting function on the inclination is given by:

$$swInc = \begin{cases} 1 & \text{for} \quad 0 \leq sInc_1 \leq Inc\min \\ \frac{Inc\max - sInc_1}{Inc\max - Inc\min} & \text{for} \quad Inc\min < sInc_1 < Inc\max, \\ 0 & \text{for} \quad sInc_1 \geq Inc\max \end{cases} \quad (1.5.1.b)$$

In this equation, $sInc_1$ is used as a constant in-between consecutive static surveys with the assumption that the inclination does not change significantly between consecutive static surveys. For example, static surveys may be performed periodically (e.g., every 33 m of drilling depth, or every 1 deg change in the computed inclination) to hold this assumption true.

In an example of low inclination drilling trajectory, $Inc_{max}$ is set at a low angle, such as 10 deg. In general, the values of $Inc_{min}$ and $Inc_{max}$ are chosen to give the lowest error on the inclination and azimuth measurements with respect to real-life noise inducing mechanisms downhole. The optimum values may be determined empirically by trial and error or using computer based optimization technique. In one or more embodiments, the weighting function generator (203) is configured to determine the values of $Inc_{min}$ and $Inc_{max}$ using simulated data for a specified level of error sources such as shock and vibration, sensor misalignment, sensor pack roll stabilization error, magnetic interference etc. In one or more embodiments, the weighting function generator (203) is configured to determine the values of $Inc_{min}$ and $Inc_{max}$ using a calibration technique to compare ground truth data and the raw data recorded by the 3-axis accelerometer and 3-axis magnetometer when drilling downhole.

Also in equation (1.5.1.a), wN is the weighting function on the number of valid data samples N during the survey timing window (e.g., 60 seconds, 3 minutes, etc.) where the roll rate is less than a threshold value, N: $|R|<R$ max.

An example weighting function on the number of valid data samples is given by:

$$wN = \begin{cases} 0 & \text{for} \quad N \leq N\min \\ \frac{N - N\min}{N\max - N\min} & \text{for} \quad N\min < N < N\max, \\ 1 & \text{for} \quad N \geq N\max \end{cases} \quad (1.5.1.c)$$

In particular, the values of $N_{min}$ and $N_{max}$, are chosen to give the lowest error on the inclination and azimuth measurement with respect to real-life occurrences of abnormal conditions downhole. The optimum values may be determined empirically by trial and error or computer based optimization technique. In one or more embodiments, the weighting function generator (203) is configured to determine the values of $N_{min}$ and $N_{max}$, using simulated data for a specified level of error sources such as shock and vibration, sensor misalignment, sensor pack roll stabilization error, magnetic interference, etc. In one or more embodiments, the weighting function generator (203) is configured to determine the values of $N_{min}$ and $N_{max}$ using a calibration technique to compare ground truth data and the raw data recorded by the 3-axis accelerometer and 3-axis magnetometer when drilling downhole.

FIGS. 1.3 and 1.4 show the example weighting function swInc on the inclination according to the equation (1.5.1.b) and the example weighting function wN on the number of valid samples according to the equation (1.5.1.c), respectively. It can be seen that swInc=1 for low inclination cases (near vertical). In addition, wN=1 for cases with few occurrences of abnormal condition, such as when the drillstring is stationary with minimum vibration and shock. In an example scenario, static surveys are performed periodically (e.g., every 33 m of drilling advancement) while continuous surveys are performed in-between consecutive static surveys. The output values of the weighting function in each continuous survey are looked up using swInc calculated in the most recent static survey and wN calculated during the current continuous survey.

In one or more embodiments, the data analyzer (204) is configured to estimate the azimuth angle using the axial vectors method and/or the 3-axis measurements method based on the environmental variables determined during the static survey. These methods may be used during static survey when the drilling is stopped or during continuous survey when the drill bit is drilling.

Using the axial vectors method, the azimuth is given by:

$$Azi_1 = \arctan 2(SAzi \cdot \sqrt{|argAzi|}, B_{zn} - G_{zn} \cdot s \sin Dip), \quad (1.4.1.a)$$

where $$arg\ Azi = 1 - G_{zn}^2 - B_{zn}^2 - s \sin Dip^2 + 2s \sin Dip \cdot G_{zn} B_{zn}, \quad (1.4.1.b)$$

is the argument of the square root, $$B_{zn} = \frac{\mu\{B_z\}}{sB_{tot}}, \quad (1.4.1.c)$$

is the average axial 3-axis magnetometer measurement normalized by the denominator sBtot (i.e., the average magnitude 3-axis magnetometer measurement,) and $$SAzi = \text{sign}(\mu\{G_x B_y - G_y B_x\}), \quad (1.4.1.d)$$

is the sign of the azimuth.

Using the 3-axis measurements method, the azimuth is given by:

$$Azi_2 = \text{arctan } 2(sG_{tot}\mu\{G_x B_y - G_y B_x\}, G_{xy}^2 \mu\{B_z\} - \mu\{G_z\}\mu\{G_x B_x + G_y B_y\}), \quad (1.4.2.a)$$

where $$G_{xy}^2 = \mu(G_x^2 + G_y^2), \quad (1.4.2.b)$$

is the average squared magnitude of the lateral accelerometer measurements.

In one or more embodiments, the data analyzer (204) is configured to use the weighting function (211) to determined the calculated azimuth (216) from $Azi_1$ and $Azi_2$ such that the 3-axis method is used only when either the inclination is low or azimuth is north-south, and when the survey data quality is high. As noted above, the survey data quality is statistically determined based on how frequent the abnormal conditions occur when the roll rate exceeds $R_{max}$. Similar to determining the environmental variables and calculating the inclination, sensor data obtained during the abnormal conditions are discarded when calculating the azimuth using equations 1.4.1.a-1.4.2.b. An example estimation of the calculated azimuth (216) is given as:

$$Azi = Azi_1 \cdot [1 - \max(swInc, swAzi) \cdot wN] + Azi_2 \cdot \max(swInc, swAzi) \cdot wN, \quad (1.5.2.a)$$

where max indicates the maximum of the input arguments. In equation (1.5.2.a), swAzi is the weighting function on the azimuth. It is based on the azimuth $sAzi_1$ that is calculated from the axial vector method during the static survey, as this value is less prone to sensor noise. An example is given by:

$$swAzi = \begin{cases} 1 & \text{for } 0 \le |sAzi_1| \le Azi\min \ \& \ 180 - Azi\min \le |sAzi_1| \le 180 \\ \dfrac{Azi\max - |sAzi_1|}{Azi\max - Azi\min} & \text{for } Azi\min < |sAzi_1| < Azi\max \\ \dfrac{|sAzi_1| + Azi\max - 180}{Azi\max - Azi\min} & \text{for } 180 - Azi\max < |sAzi_1| < 180 - Azi\min \\ 0 & \text{for } Azi\max \le |sAzi_1| \le 180 - Azi\max \end{cases} \quad (1.5.2.b)$$

In this equation, $sAzi_1$ is used as a constant in-between consecutive static surveys with the assumption that the azimuth does not change significantly between consecutive static surveys. For example, static surveys may be performed periodically (e.g., every 33 m of drilling depth, or every 1 deg change in the computed azimuth) to hold this assumption true.

FIG. 1.5 shows an example weighting function on the azimuth according to the equation (1.5.2.b). In an example scenario, static surveys are performed periodically (e.g., every 33 m of drilling advancement) while continuous surveys are performed in-between consecutive static surveys. The output values of the weighting function in each continuous survey are looked up using swInc and swAzi calculated in the most recent static survey and wN calculated during the current continuous survey.

In the example embodiments described above, the weighting functions are used to optimize contributions between 2 measurement methods. In other embodiments, a weighting function can be used among 3, 4, or more attitude determining methods.

A 3-weighting function example is shown as below:

$$Inc = Inc_1 \cdot w1 + Inc_2 \cdot w2 + Inc_3 \cdot w3, \quad (4.3.a)$$

where $$w1 + w2 + w3 = 1, \quad (4.3.b)$$

and w1, w2 and w3 are functions of the static inclination $sInc_1$.

A 4-weighting function example is shown as below:

$$Inc = Inc_1 \cdot w1 + Inc_2 \cdot w2 + Inc_3 \cdot w3 + Inc_4 \cdot w4, \quad (4.3.c)$$

where $$w1 + w2 + w3 + w4 = 1, \quad (4.3.d)$$

and w1, w2, w3 and w4 are functions of the static inclination $sInc_1$.

In another example for calculating inclination, there are six different equations that can be used. As described above, weighting functions can be written with any 2, 3, 4, 5 or 6 combinations of these equations (e.g., 57 possibilities). $Inc_1$ is the axial method and $Inc_2$ is the 3-axis lateral method described in equations 1.3.1.a and 1.3.2.a. $Inc_3$, $Inc_4$, $Inc_5$, $Inc_6$ are given by:

$$Inc_3 = \arctan2(G_{xy}/G_{zz}), \quad (4.3.e)$$

$$Inc_4 = \arccos(G_{zn'}), \quad (4.3.f)$$

$$Inc_5 = \arcsin(G_{xyn'}), \quad (4.3.g)$$

$$Inc_6 = \arctan2(G_{xyn'}/G_{zn'}), \quad (4.3.h)$$

where $$G_{xy} = \mu\{\sqrt{G_x^2 + G_y^2}\}, \quad (4.3.i)$$

-continued $$G_{zz} = \mu\{G_z\}, \quad (4.3.j)$$

$$G_{zn'} = \frac{sG_{tot} - G_{xy}}{sG_{tot}}, \quad (4.3.k)$$

and $$G_{xyn'} = \frac{sG_{tot} - G_{zz}}{sG_{tot}}. \quad (4.3.l)$$

In yet another example for calculating azimuth, in addition to (1.4.1a) and (1.4.2a), three more methods can be used as below:

$$Azi_3 = \arctan2\left(\sqrt{\frac{\cos^2(\lambda)\sin^2(\theta) - [\cos(\theta)\sin(\lambda) - \cos(Inc_1)]^2}{\cos^2(\lambda)[\sin^2(Inc_1) - \sin^2(\theta)] + [\cos(\theta)\sin(\lambda) - \cos(Inc_1)]^2}}\right), \quad (4.1.a)$$

-continued $$Azi_4 = \arccos\left(\frac{sG_{tot}B_{zz} - sB_{tot}G_{zz}\sin\lambda}{sB_{tot}\cos\left(\sqrt{sG_{tot}^2 - G_{zz}^2}\right)}\right), \quad (4.1.b)$$

$$Azi_5 = \arccos\left(\frac{\cos(\theta) - \cos(Inc_1)\sin(\lambda)}{\sin(Inc_1)\cos(\lambda)}\right), \quad (4.1.c)$$

where $$B_{zz} = \mu\{B_z\}, \quad (4.1.d)$$

$$\lambda = \arcsin(s \sin Dip), \quad (4.1.e)$$
$$\cos(\theta) = B_{zz}/sB_{tot}$$

and where $Inc_1$ is defined in equation 1.3.1.a above.

The use of weighting function is not limited to inclination and azimuth computation. In one or more embodiments, the use of weighting function is applied to other survey parameters, such as magnetic dip angle computation. As is known in the art, the magnetic dip angle is the angle between the earth's magnetic field vector and the horizontal direction.

For example:

$$Dip_1 = \arcsin(\sin Dip), \quad (4.5.a)$$

$$\sin Dip = \frac{1}{sG_{tot}sB_{tot}}\mu\{(G_xB_x + G_yB_y + G_zB_z)\}, \quad (4.5.b)$$

$$Dip_2 = \arccos(\cos Dip), \quad (4.5.c)$$

$$\cos Dip = \frac{1}{sG_{tot}sB_{tot}}\mu \quad (4.5.d)$$
$$\left\{\sqrt{(G_yB_z - G_zB_y)^2 + (G_zB_x - G_xB_z)^2 + (G_xB_y - G_yB_x)^2}\right\},$$

$$Dip = Dip_1 \cdot (1-w) + Dip_2 \cdot w, \quad (4.5.e)$$

where

W is the weighting function.

Fuzzy logic is a branch of artificial intelligence that deals with reasoning algorithms used to emulate human thinking and decision making in machines. These algorithms are used in applications where process data cannot be represented in binary form. As is known in the art, the three main actions performed by a fuzzy logic controller are:

(I) Fuzzification

When the fuzzy controller receives the input data (referred to as crisp input), it translates it into a fuzzy form. This process is referred to as fuzzification. During fuzzification, a fuzzy logic controller receives input data, also known as the fuzzy variable, and analyzes it according to user-defined charts called membership functions.

Membership functions group input data into sets, such as temperatures that are too cold, motor speeds that are acceptable, etc. The controller assigns the input data a grade from 0 to 1 based on how well it fits into each membership function. Membership functions can have many shapes, depending on the data set, but the most common are the S, Z, Δ, and Π shapes. Note that these membership functions are made up of connecting line segments defined by the lines' end points.

(II) Fuzzy Processing

In this stage, the controller performs fuzzy processing, which involves the evaluation of the input information according to IF . . . THEN rules created by the user during the fuzzy control system's programming and design stages.

(III) Defuzzification

Once the fuzzy controller finishes the rule-processing stage and arrives at an outcome conclusion, it begins the defuzzification process. In this final step, the fuzzy controller converts the output conclusions into "real" output data (referred to as crisp output).

The final output value from the fuzzy controller depends on the defuzzification method used to compute the outcome values corresponding to each label. The defuzzification process examines all of the rule outcomes after they have been logically added and then computes a value that will be the final output of the fuzzy controller. There are many defuzzification methods based on mathematical algorithms. For example, the center of gravity method, also referred to as "calculating the centroid," mathematically obtains the center of mass of the triggered output membership functions. In mathematical terms, a centroid is the point in a geometrical figure whose coordinates equal the average of all the other points comprising the figure. This point is the center of gravity of the figure. In one or more embodiments, the crisp output from the centroid defuzzifier can be expressed as follows:

$$\text{OUTPUT} = \frac{\int \mu_c(x)x\,dx}{\int \mu_c(x)\,dx}, \quad (5.1)$$

In an example of inclination computation using fuzzy logic, there are 3 membership function groups, namely 1) low static inclination, 2) medium static inclination, and 3) high static inclination. A static inclination is used as a crisp input, and an actual inclination is used as a crisp output. There are 3 inclination computation methods each using a corresponding membership function group.

Low Inclination:

$$Inc_3 = \arctan 2(G_{xy}, G_{zz}), \quad (5.2)$$

Medium Inclination:

$$Inc_1 = \arccos(G_{zn}), \quad (5.3)$$

High Inclination:

$$Inc_2 = \arcsin(G_{xyn}), \quad (5.4)$$

These three equations are chosen for demonstration purposes only. Different choice of the equations may also be used. Instead of using the weighted average formula described above, in one or more embodiments, these 3 inclination computation results are combined by an expert system (Fuzzy logic) using the example membership functions shown in FIG. 1.6. In such embodiments, the membership function is referred to as the weighting function (211).

Note that in contrast to the aforementioned weighted average formula, the fuzzy logic membership functions have different max and min overwraps (i.e., the region where the inclination is computed using more than one inclination method). For example, the max overwrap windows (defined by the end points where membership grade=1) is between 3 and 5, and between 83 and 85. In the equation Inc=Inc$_1$·(1−wInc·wN)+Inc$_2$·swInc·wN, the combined weight (swInc·wN) determines the ratio between Inc1 and Inc2. In contrast, for the fuzzy logic example, the min overwrap (defined by endpoints where membership grade=0) windows between 2 and 6 and 82 and 86. In the example shown in FIG. 1.6, a trapezoidal membership function is used. However, other membership function shapes, such as, triangular, Gaussian, Poisson, parabola, etc, can also be used in other examples.

Similar to how weighting functions are determined for the weighted average formula examples, membership functions may be derived from the field data analysis or from a simulation model of the system (e.g., sensor model, vibration/ shock model, flow model, etc.). In one or more embodiments, the weighting function generator (203) is configured to determine the membership functions as the weighting function (211).

In a modified defuzzification centroid method, results from multiple inclination computation methods ($Inc_1$, $Inc_2$, or $Inc_3$) are used in the defuzzification process. Three examples based on the example membership functions of FIG. 1.6 are shown below:

Case 1: Inc=2, $Inc_1$=1.9, $Inc_2$=2.1 and $Inc_3$=2.2

Crisp OUTPUT=$Inc_1$=1.9 degrees

Case 2: Inc=3, $Inc_1$=2.9, $Inc_2$=3.1 and $Inc_3$=3.2

Crisp OUTPUT=((Inc1Area×$Inc_1$)+ (Inc2AreaUnder0.33×$Inc_2$))/(Inc1Area+ Inc2AreaUnder0.33)=(4.5×2.9+27.33×3.1)/(4.5+ 27.33)=97.773/31.83=3.072 degrees Case 3: Inc=4, $Inc_1$=3.9, $Inc_2$=4.1 and $Inc_3$=4.2

Crisp OUTPUT=((Inc1AreaUnder0.66×$Inc_1$)+ (Inc2AreaUnder0.66×$Inc_2$))/ (Inc1AreaUnder0.66+Inc2AreaUnder0.66)= (3.3333×3.9+53.46×4.1)/(3.3333+53.46)= 232.186/56.7933=4.08826 degrees FIG. 2 depicts an example flowchart of weighting function for inclination and azimuth computation in accordance with one or more embodiments. For example, the method depicted in FIG. 2 may be practiced using the attitude calculator (200) described in reference to FIGS. 1.1 and 1.2 above. In one or more embodiments, one or more of the elements shown in FIG. 2 may be omitted, repeated, and/or performed in a different order. Accordingly, embodiments of weighting function for inclination and azimuth computation should not be considered limited to the specific arrangements of elements shown in FIG. 2.

Initially in Block 221, survey data is obtained from a sensor in a bottom hole assembly (BHA). In one or more embodiments, the survey data includes 3-axis accelerometer data and/or 3-axis magnetometer data. For example, the survey data may be obtained using a 3-axis accelerometer or a 3-axis magnetometer located on various sensor mounting platforms, such as a rotary steerable platform, a roll-stabilized platform, a non-rotating platform, or a slowly-rotating housing of the BHA. In one or more embodiments, the survey data is used to compute a survey parameter, such as the inclination, azimuth, magnetic dip, etc. of the drillstring, BHA, and the drill bit using various formulae.

In Block 222, a weighting function is determined. In one or more embodiments, the weighting function is a parameterized mathematical function specifying output values using an approximate drilling direction as input. The output results of the weighting function are referred to as weighting coefficients or weights. In one or more embodiments, the approximate drilling direction is based on the survey data during a static survey.

In one or more embodiments, the weighting function specifies weighting coefficients in a weighted average equation for combining estimates of the survey parameter as computed using the various formulae. In particular, the weighting coefficients in the weighted average equation control contributions of the various formulae to the weighted estimate. In one or more embodiments, the weighting function includes membership functions in a fuzzy logic model for combining estimates of the survey parameter as computed using the various formulae. In particular, the membership functions assign weighting coefficients in the fuzzy logic model to control contributions of the various formulae to the weighted estimate. In one or more embodiments, the values specified by the weighting function are dependent on the drilling direction. In particular, weighting coefficients are assigned to reduce inaccuracy of the weighted estimate resulting from the noise sensitivities associated with the various formulae. In one or more embodiments, the noise sensitivities are dependent on the drilling direction. Generally, some formulae are more sensitive to the noise at certain drilling direction than other formulae, and vice versa.

In the embodiments where the weighting function is a parameterized mathematical function, the parameters in the parameterized mathematical function may be determined based on a sensor noise model. In particular, the sensor noise model represents the noise induced in the 3-axis accelerometer data and/or 3-axis magnetometer data as a result of the sensor platform vibration in downhole conditions, such as the drilling induced vibration/shock. The sensor noise model also models the increased noise sensitivity of the sensor when drilling near vertical or near the north/south plane. In one or more embodiments, the parameters in the parameterized mathematical function are further determined based on a vibration model representing statistical magnitude and spectral distributions of the sensor platform vibration.

As described in reference to the weighting function generator (203) depicted in FIG. 1.2 above, the weighting function is determined to give the lowest error on the inclination and azimuth computation with respect to real-life noise inducing mechanisms downhole. The optimum values may be determined empirically by trial and error or using computer based techniques. In one or more embodiments, the weighting function is determined using simulated data for a specified level of error sources such as shock and vibration, sensor misalignment, sensor pack roll stabilization error, magnetic interference etc. In one or more embodiments, the weighting function is determined using a calibration technique to compare ground truth data and the raw data recorded by the 3-axis accelerometer and 3-axis magnetometer when drilling downhole.

In Block 223, a first estimate of the survey parameter is calculated based on the survey data using a first formula. In addition, a second estimate of the survey parameter is calculated based on the survey data using a second formula. For example, the first formula is based at least on an axial component of the survey data, such as the axial vectors method known in the art. The second formula is additionally based on a lateral component of the survey data, such as the 3-axis measurements method known in the art. Generally, the two formulae are associated with different noise sensitivities with respect to the drilling direction. For example, the axial vectors method using axial data becomes less accurate when drilling near vertical or drilling in the north-south plane due to gravity/magnetic field induced noise sensitivity of the sensors. The 3-axis measurements method using 3-axis data becomes less accurate during drilling due to shock/vibration induced noise sensitivity of the sensors. Therefore the 3-axis measurements method is more suited to conditions when the drillstring is stationary.

In Block 224, a weighted estimate of the survey parameter is determined based on the weighting function from the first estimate and the second estimate. In one or more embodiments, the weighting function adjusts, using an approximate drilling direction as input, contributions of the first estimate and the second estimate to the weighted estimate. For example, the drilling direction determined during a most recent static survey may be used as the approximate drilling direction. In another example, the first estimate or the second estimate itself may be used as the approximate drilling direction.

In particular, the contributions are adjusted to reduce the inaccuracy of the weighted estimate resulting from the noise sensitivities inherent in the formulae used to compute the first estimate and the second estimate. For example, the weighting function may maximize a weighting of 3-axis measurements method when the drilling is stopped or when the drilling operation is along near-vertical trajectory or a near-north/south trajectory, such as within 1 deg of vertical or north/south direction. In another example, the weighting function may maximize the weighting of the axial vectors method when occurrences of abnormal condition are frequent, such as during drilling.

In Block 225, the drilling operation is performed based on the weighted estimate of the survey parameter. For example, the inclination and azimuth computed based on the weighting function are used as feedback in a directional drilling controller to maintain a desired drilling trajectory.

Based on the method of using weighting function for inclination and azimuth computation described above, the accuracy of the measurement of the attitude of the drillstring is improved when the tool is drilling near vertical or near north-south, provided the rotation rate of the sensor package is sufficiently low. Typical tool configurations are a roll stabilized sensor platform or an MWD tool used with a mud motor in sliding mode. Accordingly, the drilling operator can make better informed steering command decisions and there is less uncertainty on well placement. In addition, it will lead to improvements in tool steering automation algorithms.

Figure 3:
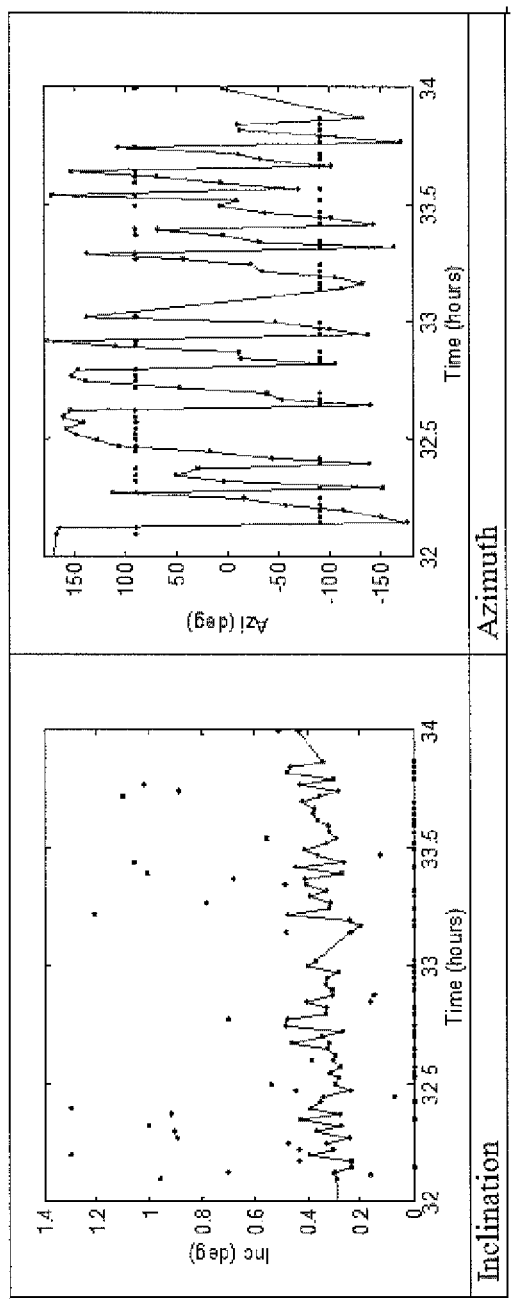
FIG. 3 depicts an example of using weighting function for inclination and azimuth computation in accordance with one or more embodiments.

An example of weighting function for inclination and azimuth computation is described in FIG. 3 below. In this example, raw data are obtained from a BHA sensor package with the tool drilling a near-vertical well (i.e., the inclination is near 0 deg). The sensor measurements are averaged and stored in the tool memory every 200 ms. In the post-processing, the length of time over which the survey was made was 90 seconds. Said in other words, each dot in FIG. 3 is calculated using raw data obtained within a 90 second survey time window or approximately 450 data samples (90 second/200 ms)). The parameters used in the weighting functions are shown in TABLE 1 below. In this example, these parameters are determined based on simulation results using a vibration model and a sensor noise model. In particular, the vibration model represents statistical magnitude and spectral distributions of the sensor platform vibration while the sensor noise model represents the noise induced in the sensor measurements (e.g., the 3-axis accelerometer data (212) and/or 3-axis magnetometer data (213) shown in FIG. 1.2) as a result of the sensor platform vibration. The sensor noise model also models the increased noise sensitivity of the sensor when drilling near vertical or near the north/south plane.

TABLE 1

| Parameter | Value |
| --- | --- |
| Incmin (deg) | 1 |
| Incmax (deg) | 3 |
| Nmin (%) | 45 |
| Nmax (%) | 90 |
| Azimin (deg) | 20 |
| Azimax (deg) | 40 |

FIG. 3 shows the improvements in the measurement of the inclination and azimuth that can be made using the weighting function method. The dots show the attitude calculated using the axial vector method (i.e., $Inc_1$ in (1.5.1a) or $Azi_1$ in (1.5.2a)). The lines show the attitude calculated using the weighting function method (i.e., Inc in (1.5.1a) or Azi in (1.5.2a)).

As can be seen in the plot of the inclination on the left side of FIG. 3, the precision of the inclination is improved by an order of magnitude range from 0 to 1.4. As can be seen in the plot of the azimuth on the right side of FIG. 3, using the axial vector method, the azimuth (represented by dots) is locked at either −90 deg or +90 deg. With the weighting function method (represented by the line), the azimuth shows the tool spiraling within the range of −160 deg to +160 deg.

Figure 4:
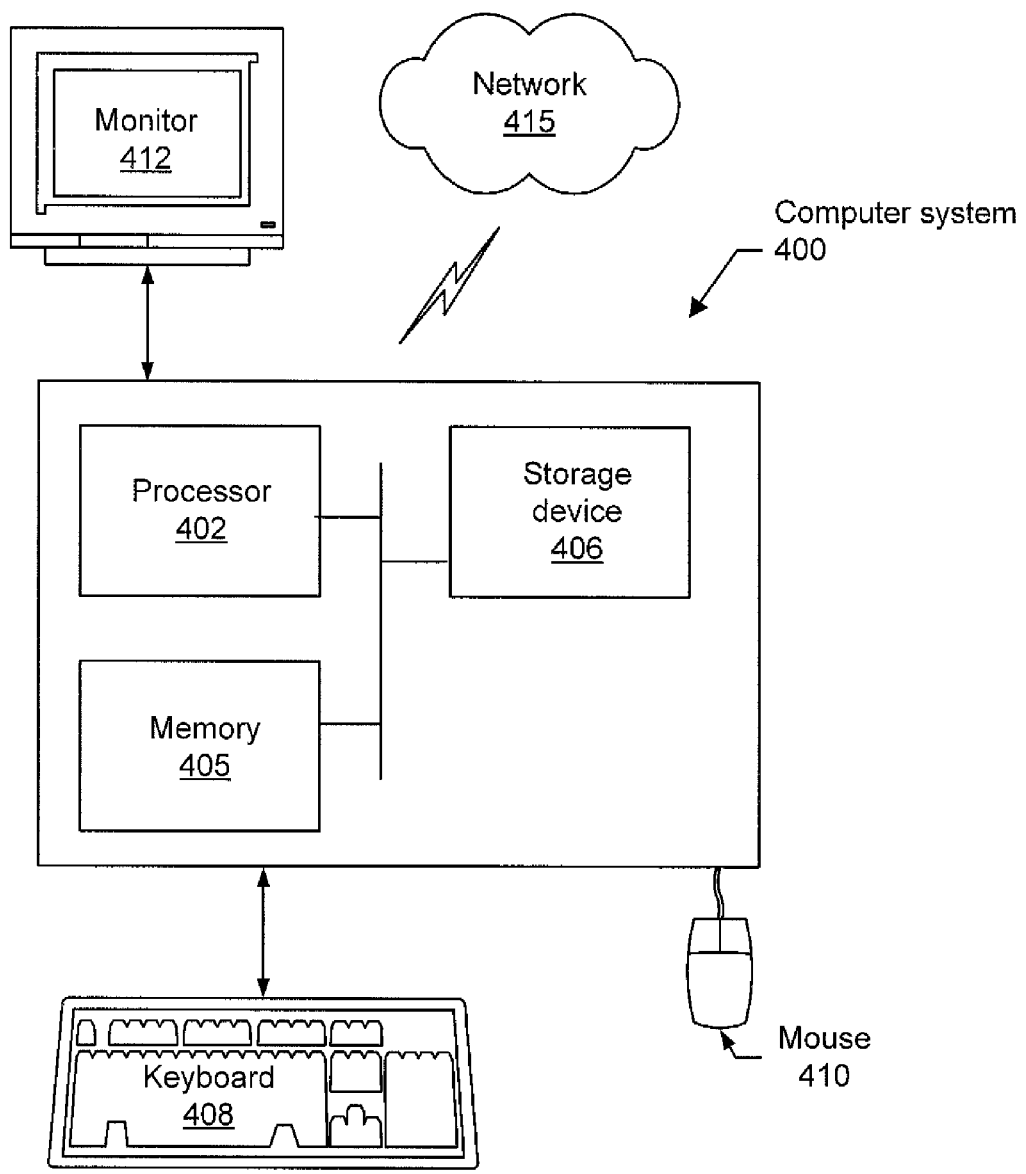
FIG. 4 depicts a computer system using which one or more embodiments of weighting function for inclination and azimuth computation may be implemented.

Embodiments of weighting function for inclination and azimuth computation may be implemented on virtually any type of computer regardless of the platform being used. For instance, as shown in FIG. 4, a computer system (400) includes one or more processor(s) (402) such as a central processing unit (CPU) or other hardware processor, associated memory (405) (e.g., random access memory (RAM), cache memory, flash memory, etc.), a storage device (406) (e.g., a hard disk, an optical drive such as a compact disk drive or digital video disk (DVD) drive, a flash memory stick, etc.), and numerous other elements and functionalities typical of today's computers (not shown). The computer (400) may also include input means, such as a keyboard (408), a mouse (410), or a microphone (not shown). Further, the computer (400) may include output means, such as a monitor (412) (e.g., a liquid crystal display LCD, a plasma display, or cathode ray tube (CRT) monitor). The computer system (400) may be connected to a network (415) (e.g., a local area network (LAN), a wide area network (WAN) such as the Internet, or any other similar type of network) via a network interface connection (not shown). Those skilled in the art will appreciate that many different types of computer systems exist (e.g., workstation, desktop computer, a laptop computer, a personal media device, a mobile device, such as a cell phone or personal digital assistant, or any other computing system capable of executing computer readable instructions), and the aforementioned input and output means may take other forms, now known or later developed. Generally speaking, the computer system (400) includes at least the minimal processing, input, and/or output means necessary to practice one or more embodiments.

Further, those skilled in the art will appreciate that one or more elements of the aforementioned computer system (400) may be located at a remote location and connected to the other elements over a network. Further, one or more embodiments may be implemented on a distributed system having a plurality of nodes, where each portion of the implementation may be located on a different node within the distributed system. In one or more embodiments, the node corresponds to a computer system. Alternatively, the node may correspond to a processor with associated physical memory. The node may alternatively correspond to a processor with shared memory and/or resources. Further, software instructions to perform one or more embodiments may be stored on a computer readable medium such as a compact disc (CD), a diskette, a tape, or any other computer readable storage device.

While weighting function for inclination and azimuth computation has been described with respect to a limited number of embodiments, those skilled in the art, having benefit of this disclosure, will appreciate that other embodiments may be devised which do not depart from the scope of weighting function for inclination and azimuth computation as disclosed herein. Accordingly, the scope of weighting function for inclination and azimuth computation should be limited only by the attached claims.

What is claimed is:

1. A method to perform a drilling operation in a subterranean formation, comprising:
   obtaining, during the drilling operation associated with a drilling direction, survey data from a sensor in a bottom hole assembly (BHA);
   calculating, by a hardware processor based on the survey data, a first estimate of a survey parameter using a first formula associated with a first noise sensitivity;
   calculating, by the hardware processor based on the survey data, a second estimate of the survey parameter using a second formula associated with a second noise sensitivity;
   assigning, based on a weighting function and the drilling direction, a plurality of weighting coefficients to the first estimate and the second estimate; and
   generating, by the hardware processor, a weighted estimate of the survey parameter based on the plurality of weighting coefficients, the first estimate, and the second estimate,
   wherein the plurality of weighting coefficients control contributions of the first estimate and the second estimate to the weighted estimate,
   wherein the plurality of weighting coefficients are assigned to reduce inaccuracy of the weighted estimate resulting from the first noise sensitivity and the second noise sensitivity, and
   wherein the first noise sensitivity and the second noise sensitivity are dependent on the drilling direction; and
   performing the drilling operation based on the weighted estimate of the survey parameter.

2. The method of claim 1,
   wherein the weighting function maximizes a weighting coefficient assigned to the first estimate when the drilling direction is along at least one selected from a group consisting of a near-vertical trajectory and a near-north/south trajectory.

3. The method of claim 1, further comprising:
   obtaining a simulation result of the sensor based on a sensor noise model, wherein the sensor noise model represents sensor noises induced by vibration of the BHA during the drilling operation; and
   determining the weighting function based on the simulation result.

4. The method of claim 1,
   wherein the first formula is based on an axial component of the survey data, and
   wherein the second formula is based on a lateral component of the survey data.

5. The method of claim 1,
   wherein the weighting function comprises membership functions for the first estimate and the second estimate in a fuzzy logic model.

6. The method of claim 1,
   wherein the survey data comprises at least one selected from a group consisting of 3-axis accelerometer data and 3-axis magnetometer data.

7. The method of claim 1,
   wherein the survey parameter comprises at least one selected from a group consisting of inclination, azimuth, and magnetic dip.

8. A system for estimating a survey parameter for a drilling operation in a subterranean formation, comprising:
   a repository configured to store survey data and a weighting function;
   a hardware processor; and
   a data analyzer executing on the hardware processor and configured to:
      obtain, during the drilling operation associated with a drilling direction, survey data from a sensor in a bottom hole assembly (BHA);
      calculate, based on the survey data, a first estimate of the survey parameter using a first formula associated with a first noise sensitivity;
      calculate, based on the survey data, a second estimate of the survey parameter using a second formula associated with a second noise sensitivity;
      assign, based on a weighting function and the drilling direction, a plurality of weighting coefficients to the first estimate and the second estimate; and
      generate a weighted estimate of the survey parameter based on the plurality of weighting coefficients, the first estimate, and the second estimate,
      wherein the plurality of weighting coefficients control contributions of the first estimate and the second estimate to the weighted estimate,
      wherein the plurality of weighting coefficients are assigned to reduce inaccuracy of the weighted estimate resulting from the first noise sensitivity and the second noise sensitivity, and
      wherein the first noise sensitivity and the second noise sensitivity are dependent on the drilling direction; and
   wherein the drilling operation is performed based on the weighted estimate of the survey parameter.

9. The system of claim 8,
   wherein the weighting function maximizes a weighting coefficient assigned to the first estimate when the drilling direction is along at least one selected from a group consisting of a near-vertical trajectory and a near-north/south trajectory.

10. The system of claim 8, further comprising a weighting function generator configured to:
    obtain a simulation result of the sensor based on a sensor noise model, wherein the sensor noise model represents sensor noises induced by vibration of the BHA during the drilling operation; and
    determine the weighting function based on the simulation result.

11. The system of claim 8,
    wherein the first formula is based at least on an axial component of the survey data, and
    wherein the second formula is based at least on a lateral component of the survey data.

12. The system of claim 8,
    wherein the weighting function comprises membership functions for the first estimate and the second estimate in a fuzzy logic model.

13. The system of claim 8,
    wherein the survey data comprises at least one selected from a group consisting of 3-axis accelerometer data and 3-axis magnetometer data.

14. The system of claim 8,
    wherein the survey parameter comprises at least one selected from a group consisting of inclination, azimuth, and magnetic dip.

15. A non-transitory computer readable medium storing instructions for estimating a survey parameter for a drilling operation in a subterranean formation, the instructions when executed causing a processor to:
    obtain, during the drilling operation associated with a drilling direction, survey data from a sensor in a bottom hole assembly (BHA);

calculate, based on the survey data, a first estimate of the survey parameter using a first formula associated with a first noise sensitivity;

calculate, based on the survey data, a second estimate of the survey parameter using a second formula associated with a second noise sensitivity;

assign, based on a weighting function and the drilling direction, a plurality of weighting coefficients to the first estimate and the second estimate; and generate a weighted estimate of the survey parameter based on the plurality of weighting coefficients, the first estimate, and the second estimate, wherein the plurality of weighting coefficients control contributions of the first estimate and the second estimate to the weighted estimate, wherein the plurality of weighting coefficients are assigned to reduce inaccuracy of the weighted estimate resulting from the first noise sensitivity and the second noise sensitivity, and wherein the first noise sensitivity and the second noise sensitivity are dependent on the drilling direction.

16. The non-transitory computer readable medium of claim 15, the instructions when executed further causing a processor to:

obtain a simulation result of the sensor based on a sensor noise model, wherein the sensor noise model represents sensor noises induced by vibration of the BHA during the drilling operation; and determine the weighting function based on the simulation result.

17. The non-transitory computer readable medium of claim 15, wherein the first formula is based at least on an axial component of the survey data, and wherein the second formula is based at least on a lateral component of the survey data.

18. The non-transitory computer readable medium of claim 15, wherein the weighting function comprises weighting coefficients for the first estimate and the second estimate in a weighted average equation.

19. The non-transitory computer readable medium of claim 15, wherein the weighting function comprises membership functions for the first estimate and the second estimate in a fuzzy logic model.

20. The non-transitory computer readable medium of claim 15, wherein the survey data comprises at least one selected from a group consisting of 3-axis accelerometer data and 3-axis magnetometer data, and wherein the survey parameter comprises at least one selected from a group consisting of inclination, azimuth, and magnetic dip.

* * * * *